(12) United States Patent
Ro

(10) Patent No.: US 11,483,940 B2
(45) Date of Patent: Oct. 25, 2022

(54) ELECTRONIC APPARATUS

(71) Applicant: Samsung Display Co., Ltd., Yongin-Si (KR)

(72) Inventor: Jinyoung Ro, Asan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 17/306,060

(22) Filed: May 3, 2021

(65) Prior Publication Data
US 2022/0022331 A1 Jan. 20, 2022

(30) Foreign Application Priority Data

Jul. 15, 2020 (KR) ........................ 10-2020-0087409

(51) Int. Cl.
*H05K 5/02* (2006.01)
*H05K 5/00* (2006.01)
(Continued)

(52) U.S. Cl.
CPC ......... *H05K 5/0217* (2013.01); *G06F 3/0412* (2013.01); *H05K 5/0017* (2013.01);
(Continued)

(58) Field of Classification Search
CPC .... G06F 1/1613; G06F 1/1628; G06F 1/1652; G06F 1/1656; G06F 1/203; G06F 3/0412; G06F 3/0445; G06F 3/0446; G06F 2203/04102; G06F 2203/04103; G06F 2203/04111; G06F 3/04164; G09F 9/301; H05K 5/0017; H05K 5/0217; H05K 5/03; C09J 2203/318
See application file for complete search history.

(56) References Cited

U.S. PATENT DOCUMENTS 9,806,284 B2 10/2017 Goto et al.
9,985,228 B2 * 5/2018 Tsuruoka ............ H01L 51/0097
(Continued)

FOREIGN PATENT DOCUMENTS

JP 2020503651 A 1/2020
KR 1020170116302 A 10/2017
(Continued)

*Primary Examiner* — Nelson M Rosario
(74) *Attorney, Agent, or Firm* — Cantor Colburn LLP

(57) ABSTRACT

An electronic apparatus includes a display module divided into a bending area and a non-bending area arranged in a first direction and having a front surface and a rear surface opposing the front surface, a cover member covering a portion of the bending area and disposed on the front surface, a first protection member disposed on the rear surface overlapping the non-bending area, a second protection member disposed on the rear surface overlapping the bending area and spaced apart from the first protection member, a driving element disposed on the front surface overlapping the bending area, and a stiffener disposed between the cover member and the driving element on the front surface. The bending area is bent along a virtual bending axis extending in a second direction perpendicular to the first direction, and the cover member and the stiffener expose a portion of the front surface through a space therebetween.

20 Claims, 10 Drawing Sheets

(51) Int. Cl.
    *H05K 5/03*      (2006.01)
    *G06F 3/041*     (2006.01)
    *G06F 3/044*     (2006.01)

(52) U.S. Cl.
    CPC ............ *H05K 5/03* (2013.01); *G06F 3/0446* (2019.05); *G06F 3/04164* (2019.05); *G06F 2203/04102* (2013.01); *G06F 2203/04111* (2013.01)

(56) References Cited

U.S. PATENT DOCUMENTS

| | | | |
|---|---|---|---|
| 9,989,791 B2 | 6/2018 | Cheng | |
| 9,991,456 B2 | 6/2018 | Senda et al. | |
| 10,050,227 B2 | 8/2018 | Park et al. | |
| 10,135,013 B2 | 11/2018 | Andou | |
| 10,381,594 B2 | 8/2019 | Jiang | |
| 10,461,273 B2 | 10/2019 | Andou | |
| 10,490,755 B2 | 11/2019 | Jang et al. | |
| 10,496,136 B2 | 12/2019 | Kim et al. | |
| 10,535,615 B2 | 1/2020 | Dubey et al. | |
| 10,547,025 B2 | 1/2020 | Choi et al. | |
| 2019/0022980 A1* | 1/2019 | Chu | H01L 51/0097 |
| 2019/0107866 A1* | 4/2019 | Han | G06F 1/1626 |
| 2019/0318689 A1 | 10/2019 | Kim | |
| 2020/0052248 A1 | 2/2020 | Cho et al. | |
| 2021/0410305 A1* | 12/2021 | Feng | G06F 1/1652 |

FOREIGN PATENT DOCUMENTS

| | | |
|---|---|---|
| KR | 1020170122184 A | 11/2017 |
| KR | 1020180005313 A | 1/2018 |
| KR | 1020180023133 A | 3/2018 |
| KR | 1020180033364 A | 4/2018 |
| KR | 101886741 B1 | 8/2018 |
| KR | 1020190072876 A | 6/2019 |
| KR | 102037694 B1 | 10/2019 |
| KR | 1020190119244 A | 10/2019 |
| KR | 1020200019301 A | 2/2020 |

* cited by examiner

ELECTRONIC APPARATUS

This application claims priority to Korean Patent Application No. 10-2020-0087409, filed on Jul. 15, 2020, and all the benefits accruing therefrom under 35 U.S.C. § 119, the content of which in its entirety is herein incorporated by reference.

BACKGROUND

The present disclosure herein relates to an electronic apparatus, and more particularly, to an electronic apparatus having improved reliability.

An electronic apparatus is activated according to electrical signals. The electronic apparatus may include a device composed of various electronic components, such as a display unit to display an image or an input sensing unit to sense an external input. The electronic component may be electrically connected to one another through variously arranged signal lines.

The signal lines may be provided in a variety of different numbers depending on the number of electronic components or processing environment, and are designed to be bent and arranged in an appropriate space to prevent electrical signal interference within a predetermined panel area.

SUMMARY

The disclosure provides an electronic apparatus in which a protection member and a stiffener are disposed with a predetermined space therebetween, thereby capable of preventing a defect generated when being bent.

An embodiment of the inventive concept provides an electronic apparatus including a display module divided into a bending area and a non-bending area arranged in a first direction and having a front surface and a rear surface facing the front surface, a cover member covering a portion of the bending area and disposed on the front surface, a first protection member disposed on the rear surface and overlapping the non-bending area, a second protection member disposed on the rear surface, overlapping the bending area and spaced apart from the first protection member, a driving element disposed on the front surface and overlapping the bending area, and a stiffener disposed between the cover member and the driving element on the front surface, wherein the bending area is bent along a virtual bending axis extending in a second direction perpendicular to the first direction, and the cover member and the stiffener expose a portion of the front surface through a space between the cover member and the stiffener.

A distance from a side surface of the second protection member facing a side surface of the first protection member to a side surface of the stiffener adjacent to the cover member in the first direction may be about 2.0 millimeters (mm) or greater.

The stiffener may be attached to the front surface through an adhesive layer.

The side surface of the stiffener adjacent to the cover member may be aligned with a side surface of the adhesive layer adjacent to the cover member.

The stiffener may include a first portion overlapping the adhesive layer, and a second portion protruding towards the cover member from the first portion.

The second portion may be inclined with respect to the side surface of the adhesive layer adjacent to the cover member.

The stiffener may include stainless steel.

The cover member may include a first cover part adjacent to the non-bending area, and a second cover part extending from the first cover part, and the second cover part may be inclined towards the stiffener from the first cover part when the display module is not bent.

The electronic apparatus may further include a functional layer which is disposed between the first protection member and the second protection member in a state that the electronic apparatus is bent along the virtual bending axis, and the functional layer may include at least one of a light blocking layer, a heat dissipation layer, and a cushion layer.

The display module may include a display panel having a plurality of pixels, and an input sensing panel directly disposed on the display panel and which senses an external input.

The input sensing panel may include a first sensing insulating layer in contact with the display panel, a first conductive layer disposed on the first sensing insulating layer, a second sensing insulating layer disposed on the first sensing insulating layer and covering the first conductive layer, a second conductive layer disposed on the second sensing insulating layer, and a third sensing insulating layer disposed on the second sensing insulating layer and covering the second conductive layer.

The stiffener may surround at least a portion of the driving element.

The electronic apparatus may further include a flexible circuit board disposed on the front surface and overlapping the bending area, and a main circuit board connected to the display module through the circuit board.

In an embodiment of the inventive concept, an electronic apparatus includes a display panel divided into a bending area and a non-bending area arranged in a first direction and having a front surface which displays an image and a rear surface facing the front surface, an input sensing panel which senses an external input, is disposed on the front surface and overlaps the non-bending area, a cover member covering a portion of the bending area and disposed on the front surface, a first protection member disposed on the rear surface overlapping the non-bending area, a second protection member disposed on the rear surface overlapping the bending area and spaced apart from the first protection member, a driving element disposed on the front surface and overlapping the bending area, and a stiffener disposed between the cover member and the driving element on the front surface, wherein the bending area is bent along a virtual bending axis extending in a second direction perpendicular to the first direction, and the cover member and the stiffener expose a portion of the front surface through a space between the cover member and the stiffener.

The distance from a side surface of the second protection member facing a side surface of the first protection member to a side surface of the stiffener adjacent to the cover member in the first direction may be about 2.0 mm or greater.

The stiffener may be attached to the front surface through an adhesive layer.

The side surface of the stiffener adjacent to the cover member may be aligned with a side surface of the adhesive layer adjacent to the cover member.

The stiffener may include a first portion overlapping the adhesive layer, and a second portion protruding towards the cover member from the first portion.

The second portion may be inclined with respect to the side surface of the adhesive layer adjacent to the cover member.

The input sensing panel may include a first sensing insulating layer in contact with the display panel, a first conductive layer disposed on the first sensing insulating layer, a second sensing insulating layer disposed on the first sensing insulating layer and covering the first conductive layer, a second conductive layer disposed on the second sensing insulating layer, and a third sensing insulating layer disposed on the second sensing insulating layer and covering the second conductive layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
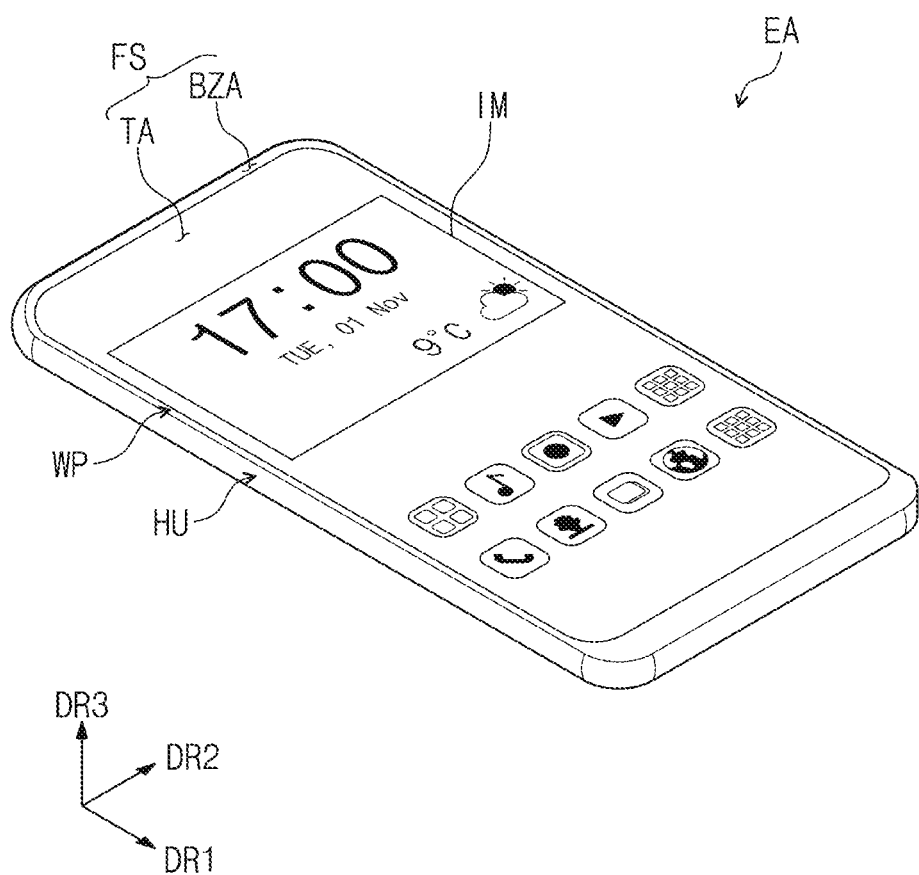
FIG. 1 is a perspective view of an electronic apparatus according to an embodiment of the inventive concept.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof. Hereinafter, embodiments of the inventive concept will be described with reference to the accompanying drawings.

Figure 2A:
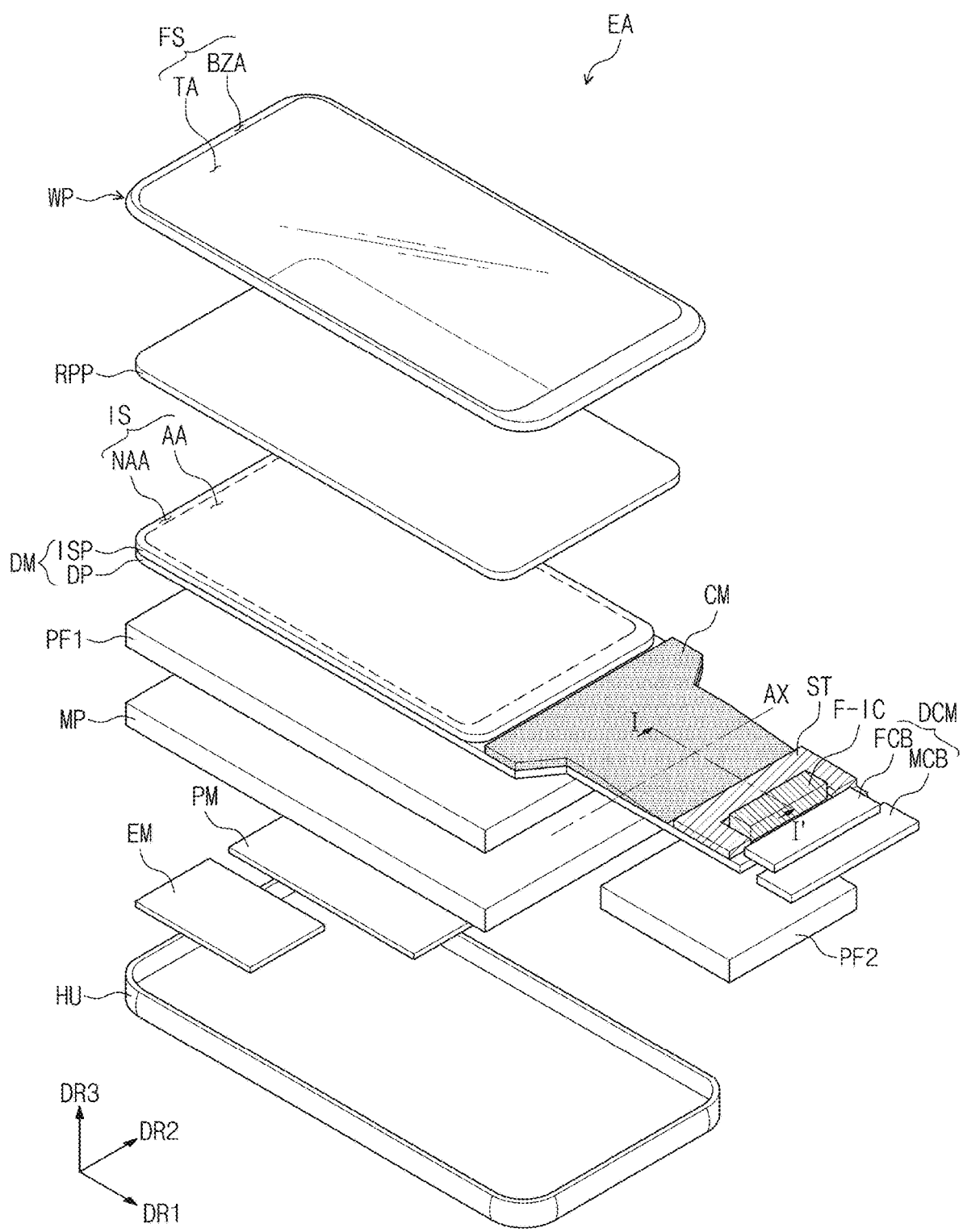
FIG. 2A is an exploded perspective view of an electronic apparatus according to an embodiment of the inventive concept.
Figure 2B:
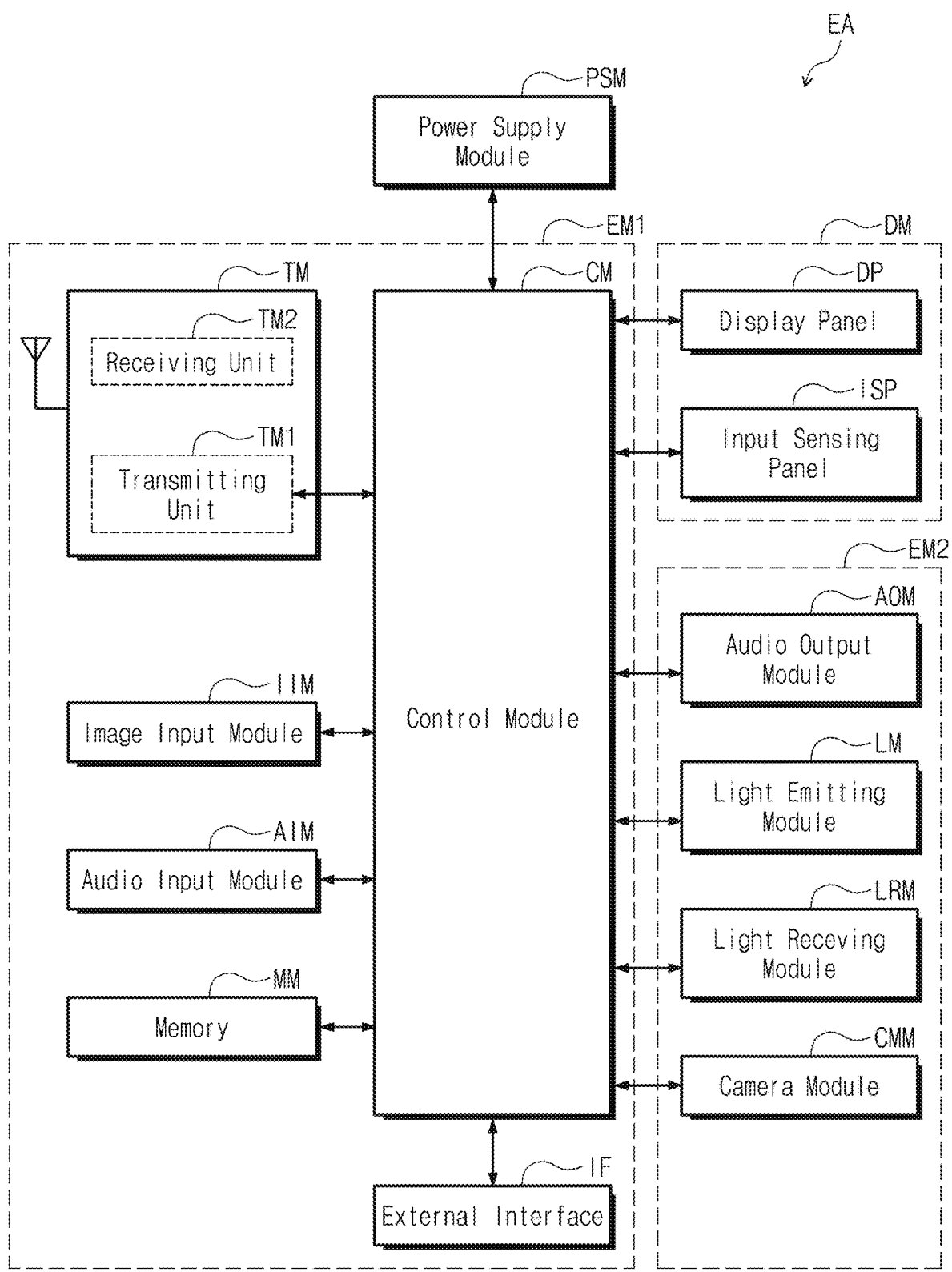
FIG. 2B is a block diagram of an electronic apparatus according to an embodiment of the inventive concept.

FIG. 1 is a perspective view of an electronic apparatus according to an embodiment of the inventive concept. FIG. 2A is an exploded perspective view of an electronic apparatus according to an embodiment of the inventive concept. FIG. 2B is a block diagram of an electronic apparatus according to an embodiment of the inventive concept.

Referring to FIGS. 1 and 2B, an electronic apparatus EA may be an apparatus activated according to electrical signals. The electronic apparatus EA may include various embodiments. For example, the electronic apparatus EA may not only be used for large-sized electronic apparatuses such as a television set, a monitor, or an outdoor billboard but also used for small- and medium-sized electronic apparatuses such as a personal computer, a laptop computer, a personal digital terminal, a car navigation unit, a game console, a portable electronic device, and a camera. In addition, these are merely presented as an example, and thus the electronic apparatus may be adopted for other electronic apparatuses without departing from the inventive concept. In the present embodiment, a smartphone is exemplarily illustrated as the electronic apparatus EA.

The electronic apparatus EA may display an image IM towards a third direction DR3 on a display surface FS parallel to a first direction DR1 and a second direction DR2, respectively. The image IM may include a still image as well as a dynamic image. FIG. 1 illustrates watch windows and icons as an example of the image IM. The display surface FS on which the image IM is displayed may correspond to a front surface of the electronic apparatus EA and correspond to a front surface of a window panel WP.

In an embodiment, a front surface (in other words, an upper surface) and a rear surface (in other words, a lower surface) of each member is defined with respect to a direction in which the image IM is displayed. Front and rear surfaces may oppose each other in a third direction DR3 and the normal direction of each of the front and rear surfaces may be parallel to the third direction DR3.

The directions indicated by the first to third directions DR1, DR2, and DR3 are relative concepts, and may thus be changed to other directions. In the present description, "on a plane" or "in a plan view" may be defined as viewed from the third direction DR3.

The electronic apparatus EA may include a window panel WP, an anti-reflection panel RPP, a display module DM, a cover member CM, a stiffener ST, a driving element F-IC, a driving control unit DCM, protection members PF1 and PF2, a functional layer MP, an electronic module EM, a power supply module PSM, and a housing HU. In an embodiment, the window panel WP and the housing HU may combine to form the exterior of the electronic apparatus EA.

The window panel WP may include an optically transparent insulating material. For example, the window panel WP may include glass or plastic. The window panel WP may have a multi-layer structure or a single-layer structure. For example, the window panel WP may include a plurality of plastic films which are bonded through an adhesive, or may include a glass substrate and a plastic film which are bonded through an adhesive.

As described above, the display surface FS of the window panel WP may define a front surface of the electronic apparatus EA. A transmission area TA may be an optically transparent area. For example, the transmission area TA may be an area having a visible light transmittance of about 90% or greater.

A bezel area BZA may be an area having a relatively lower light transmittance than the transmission area TA. The bezel area BZA may define the outer shape of the transmission area TA. The bezel area BZA may be adjacent to the transmission area TA and surround the transmission area TA.

The bezel area BZA may have a predetermined color through a bezel pattern WM (see FIG. 6), which will be described later. The bezel area BZA may cover a peripheral area NAA of the display module DM to prevent the peripheral area NAA from being viewed from the outside. However, this is exemplarily illustrated, and in the window panel WP according to another embodiment of the inventive concept, the bezel area BZA may be omitted.

The anti-reflection panel RPP may be disposed under the window panel WP. The anti-reflection panel RPP may reduce reflectance of external light incident from the window panel WM. The anti-reflection panel RPP according to an embodiment of the inventive concept may be omitted, and may be configured to be included in the display module DM.

The display module DM may display an image IM and sense an external input. The display module DM may include a front surface IS having an active area AA and a peripheral area NAA. The active area AA may be an area activated according to electrical signals.

In an embodiment, the active area AA may be an area for displaying an image IM, and may be an area sensing an external input as well. The transmission area TA may overlap the front surface IS or at least a portion of the active area AA.

Accordingly, a user may view the image IM through the transmission area TA or provide an external input. However, this is exemplarily illustrated, and in the display module DM according to an embodiment of the inventive concept, an area displaying the image IM and an area sensing an external input may be separated from each other in the active area AA, and is not limited to any one embodiment above.

The peripheral area NAA may be an area covered by the bezel area BZA. The peripheral area NAA may be adjacent to the active area AA. The peripheral area NAA may surround the active area AA. A driving element or driving wiring for driving the active area AA may be disposed in the peripheral area NAA.

The display module DM may include a display panel DP and an input sensing panel ISP. The display panel DP may be configured to substantially generate an image IM. The image IM generated by the display panel DP may be viewed by a user from the outside through the transmission area TA.

The external input may include various forms of inputs provided from the outside the electronic apparatus EA. For example, the external input may include an external input applied when approaching the electronic apparatus EA or being adjacent by a predetermined distance (e.g., hovering), as well as contact by a part of a body such as a user's hand. In addition, the external input may have various forms such as force, pressure, and light, and is not limited to any one embodiment above.

The cover member CM is disposed on the display module DM. For example, the cover member CM may be disposed on the display panel DP and overlap the peripheral area NAA. The cover member CM may relieve stress generated when a portion of the display panel DP overlapping the peripheral area NAA is bent. The cover member CM includes a synthetic resin. For example, the cover member CM may include at least any one among acrylonitrile butadiene styrene copolymer ("ABS"), urethane acrylate ("UA"), polyurethane ("PU"), polyethylene ("PE"), ethylene vinyl acetate ("EVA"), and polyvinyl chloride ("PVC").

The driving element F-IC is disposed on the display module DM. For example, the driving element F-IC may be disposed on the portion of the display panel DP overlapping the peripheral area NAA, and may be disposed to be spaced apart from the cover member CM.

The driving element F-IC may include driving elements for driving the display module DM. For example, the driving element F-IC may include a timing controller that controls the display panel DP included in the display module DM. The timing controller may receive input image signals and convert the input image signals into image data to be displayed by pixels. In addition, the timing controller may receive various control signals, for example, a vertical synchronization signal, a horizontal synchronization signal, a main clock signal, and a data enable signal, and may output signals corresponding to each of the signals.

In addition, the driving element F-IC may further include a circuit unit that controls an input sensing panel ISP, and is not limited to any one embodiment above.

The driving control unit DCM may include a main circuit board MCB and a flexible circuit board FCB. The driving control unit DCM may be electrically connected to the display module DM to control the display panel DP and the input sensing panel ISP. The flexible circuit board FCB may be connected to an end of the display panel DP to connect the main circuit board MCB with the driving element F-IC.

The main circuit board MCB may further include a plurality of electronic components mounted on the main circuit board MCB. The electronic components may be electrically connected through circuit wirings. The main circuit board MCB may be electrically connected to the display module DM connected to the driving element F-IC through the flexible circuit board FCB.

In addition, the main circuit board MCB may further include a protection cap covering the electronic components. The protection cap may be a protection cover made of metal and may combine with the main circuit board MCB through soldering. The main circuit board MCB may be electrically connected to a motherboard of an electronic module EM through a connector (not shown). The flexible circuit board FCB may include a flexible film, a plurality of circuit wirings disposed on the flexible film, and pads corresponding to the pads included in the display panel DP.

The stiffener ST is disposed on the display panel DP. For example, the stiffener ST may be disposed between the driving element F-IC and the cover member CM.

Figure 7:
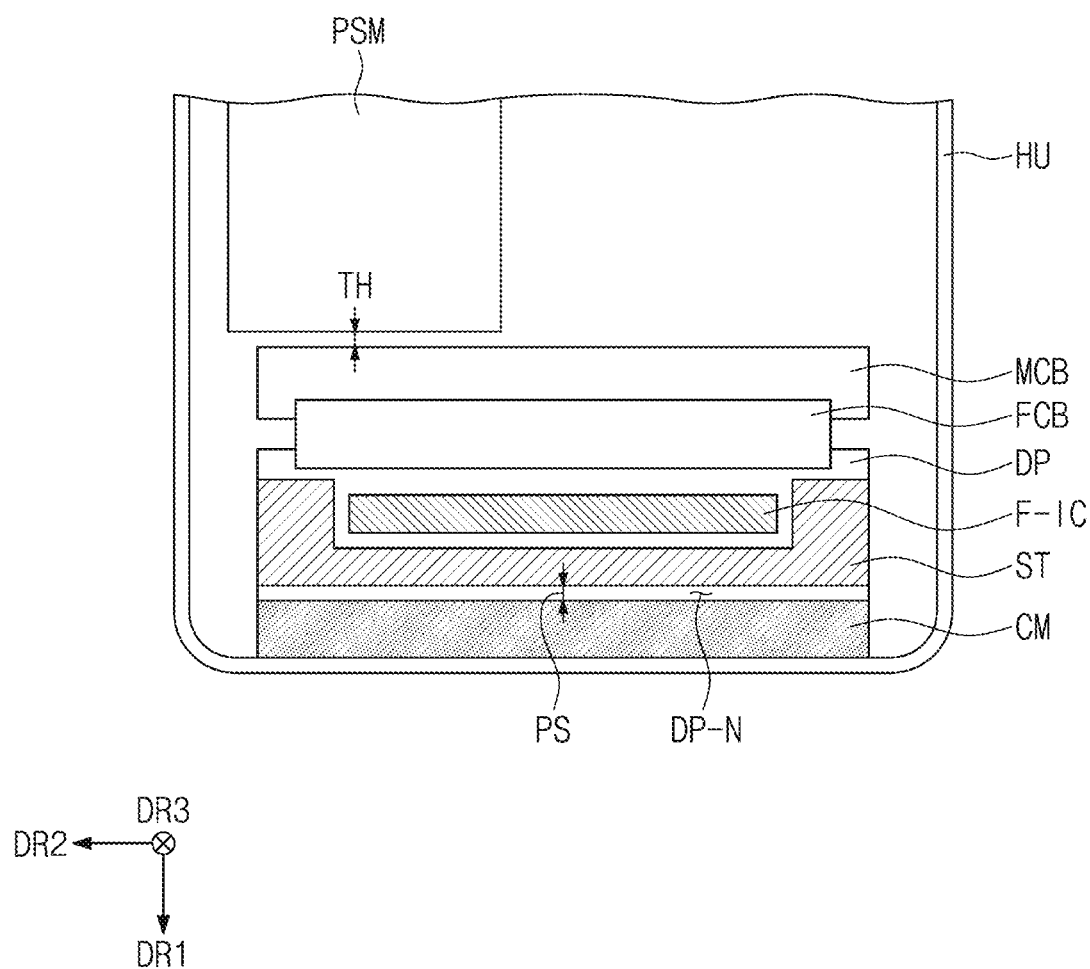
FIG. 7 is a rear view of an electronic apparatus according to an embodiment of the inventive concept.

The stiffener ST may surround at least a portion of the driving element F-IC (See FIG. 7). For example, the stiffener ST may surround the remaining surfaces of the driving element F-IC except for a surface adjacent to the flexible circuit board FCB. Accordingly, the stress generated when the display panel DP in an area where the driving element F-IC is disposed is bent may be prevented from being transmitted to the driving element F-IC. Thus, the display module DM having improved reliability may be provided. The stiffener ST may include stainless steel.

The protection members PF1 and PF2 may be disposed on the rear surface of the display panel DP. That is, the protection members PF1 and PF2 may be disposed on a surface opposing the surface on which the input sensing panel ISP, the cover member CM, the stiffener ST, the driving element F-IC, and the flexible circuit board FCB are disposed.

The first protection member PF1 and the second protection member PF2 may be disposed to be spaced apart from each other. The first protection member PF1 may overlap the input sensing panel ISP when the display panel DP is not bent. The second protection member PF2 may overlap a portion of the cover member CM, the stiffener ST, the driving element F-IC, and the flexible circuit board FCB when the display panel DP is not bent.

The protection members PF1 and PF2 may include a plastic film as a base layer. The protection members PF1 and PF2 may include a plastic film including any one selected from the group consisting of polyethylene terephthalide ("PET"), polyethylene (PE), polyvinyl chloride (PVC), polypropylene ("PP"), polystyrene ("PS"), polyacrylonitrile ("PAN"), styrene-acrylonitrile copolymer ("SAN"), acrylonitrile-butadiene-styrene (ABS), polymethyl methacrylate ("PMMA"), and a combination thereof. The electronic apparatus EA according to the inventive concept includes the protection members PF1 and PF2 disposed on the rear surface of the display panel DP, and may thus have excellent heat resistance, fatigue strength, and electrical characteristics, and be less affected by temperature and humidity.

Materials forming the protection members PF1 and PF2 are not limited to plastic resins, and may include organic/inorganic composite materials. The protection members PF1 and PF2 may include a porous organic layer and an inorganic material filled in the pores of the organic layer.

The functional layer MP may be disposed on the rear surface of the display panel DP. To be more specific, the functional layer MP may be disposed between the first protection member PF1 and the second protection member PF2 when the display panel DP is bent (See FIG. 6). The functional layer MP may include a plurality of layers. For example, the functional layer MP may include a light blocking layer, a heat dissipation layer, a cushion layer, and a plurality of adhesive layers.

The light blocking layer may serve to prevent components disposed on the display module DM from being viewed through active areas AA. Although not illustrated, the light blocking layer may include a binder and a plurality of pigment particles dispersed therein. The pigment particles may include carbon black, etc. The electronic apparatus EA according to an embodiment of the inventive concept includes the light blocking layer, and may thus have enhanced light blocking properties.

The heat dissipation layer may effectively dissipate heat generated from the display module DM. The heat dissipation layer may include at least any one among graphite, copper (Cu), and aluminum (Al), which have excellent heat dissipation properties, and is not limited thereto. The heat dissipation layer may not only enhance heat dissipation properties, but also have electromagnetic wave shielding or electromagnetic wave absorption properties.

The cushion layer may be a synthetic resin foam. The cushion layer may include matrix and a plurality of voids. The cushion layer may have elasticity and a porous structure.

The matrix may include a flexible material. The matrix may include a synthetic resin. For example, the matrix may include at least any one among acrylonitrile butadiene styrene copolymer (ABS), polyurethane (PU), polyethylene (PE), ethylene vinyl acetate (EVA), and polyvinyl chloride (PVC).

A plurality of voids easily absorbs shocks applied to the cushion layer. The plurality of voids may be defined as the cushion layer has a porous structure.

However, the embodiment of the inventive concept is not limited thereto, and at least any one among the light blocking layer, the heat dissipation layer, and the cushion layer may be omitted, and a plurality of layers may be provided as a single layer, and the embodiment of the inventive concept is not limited thereto.

The electronic module EM includes a motherboard and various functional modules mounted on the motherboard and operating the electronic apparatus EA. The motherboard may be electrically connected to the display module DM through a connector (not shown). In this case, the motherboard may include a rigid-type printed circuit board.

As shown in FIG. 2B, the electronic module EM may include a control module 10, a wireless communication module 20, an image input module 30, an audio input module 40, an audio output module 50, and a memory 60, an external interface 70, a light emitting module 80, a light receiving module 90, a camera module 100, etc. Some of the modules may not be mounted on the motherboard but may be electrically connected to the motherboard through a flexible circuit board.

The control module 10 controls the overall operation of the electronic apparatus EA. The control module 10 may be a microprocessor. For example, the control module 10 activates or deactivates the display unit DU. The control module 10 may control the image input module 30, the audio input module 40, the audio output module 50, etc., based on touch signals received from the display unit DU.

The wireless communication module 20 may transmit/receive wireless signals to/from another terminal using a Bluetooth or a Wi-Fi line. The wireless communication module 20 may transmit/receive voice signals using a general communication line. The wireless communication module 20 includes a transmission unit 22 for modulating and transmitting signals to be transmitted, and a reception unit 24 for demodulating received signals.

The image input module 30 processes an image signal and converts the image signal into image data that may be displayed on the display apparatus DD. The audio input module 40 receives an external audio signal through a microphone in a recording mode, a voice recognition mode, etc., and converts the signal into electrical voice data. The audio output module 50 converts the audio data received from the wireless communication module 20 or the audio data stored in the memory 60, and outputs the audio data to the outside.

The external interface 70 serves as an interface connected to an external charger, a wired/wireless data port, a card socket (e.g., a memory card, a SIM/UIM card), etc.

The light emitting module 80 generates and outputs light. The light emitting module 80 may output infrared rays. The light emitting module 80 may include an LED element. The light receiving module 90 may sense infrared rays. The light receiving module 90 may be activated when an infrared ray of a predetermined level or higher is sensed. The light receiving module 90 may include a CMOS sensor. After the infrared light generated in the light emitting module 80 is outputted, the infrared light is reflected by an external object (e.g., a user's finger or face), and the reflected infrared light may be incident on the light receiving module 90. The camera module 100 captures an image of the outside.

The power supply module PSM supplies power required for the overall operation of the electronic apparatus EA. The power supply module PSM may include a conventional battery module.

The housing HU accommodates the display module DM. The housing HU may combine with the window panel WP to form the exterior of the electronic apparatus EA. The outer case EDC absorbs shocks applied from the outside and prevents foreign substances/moisture from penetrating into the display module DM to protect the components received in the housing HU. Meanwhile, although not shown, the housing HU may be provided in the form in which a plurality of storage members combines.

Figure 3A:
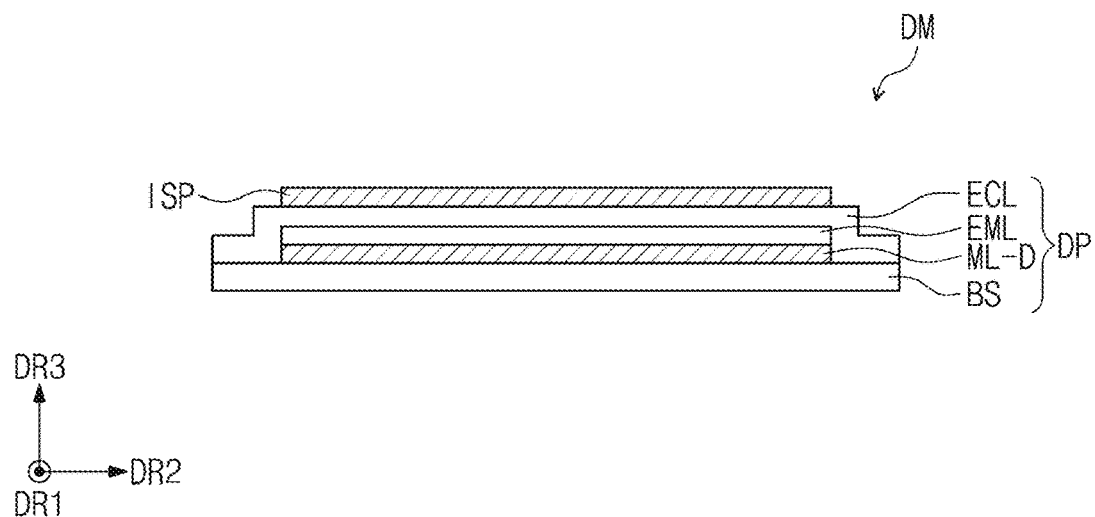
FIG. 3A is a cross-sectional view of a display module according to an embodiment of the inventive concept.
Figure 3B:
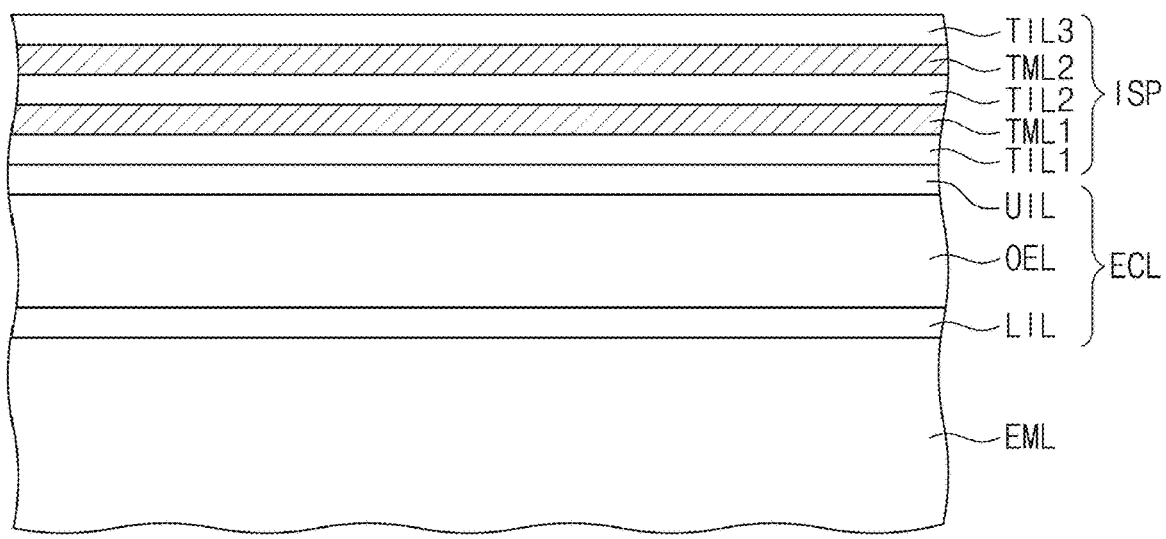
FIG. 3B is an enlarged cross-sectional view of the display module of FIG. 3A.
Figure 4:
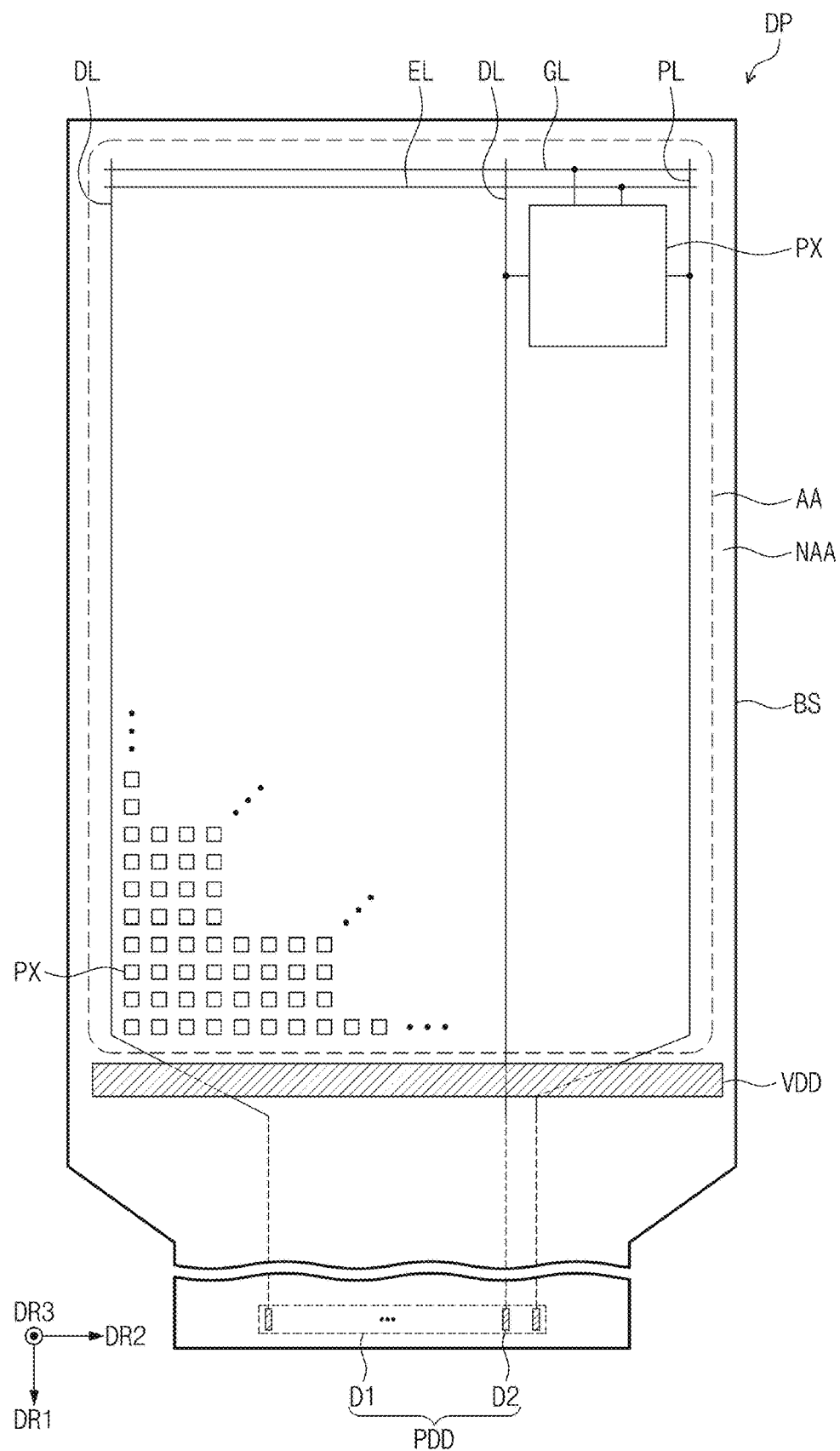
FIG. 4 is a plan view of a display panel according to an embodiment of the inventive concept.
Figure 5:
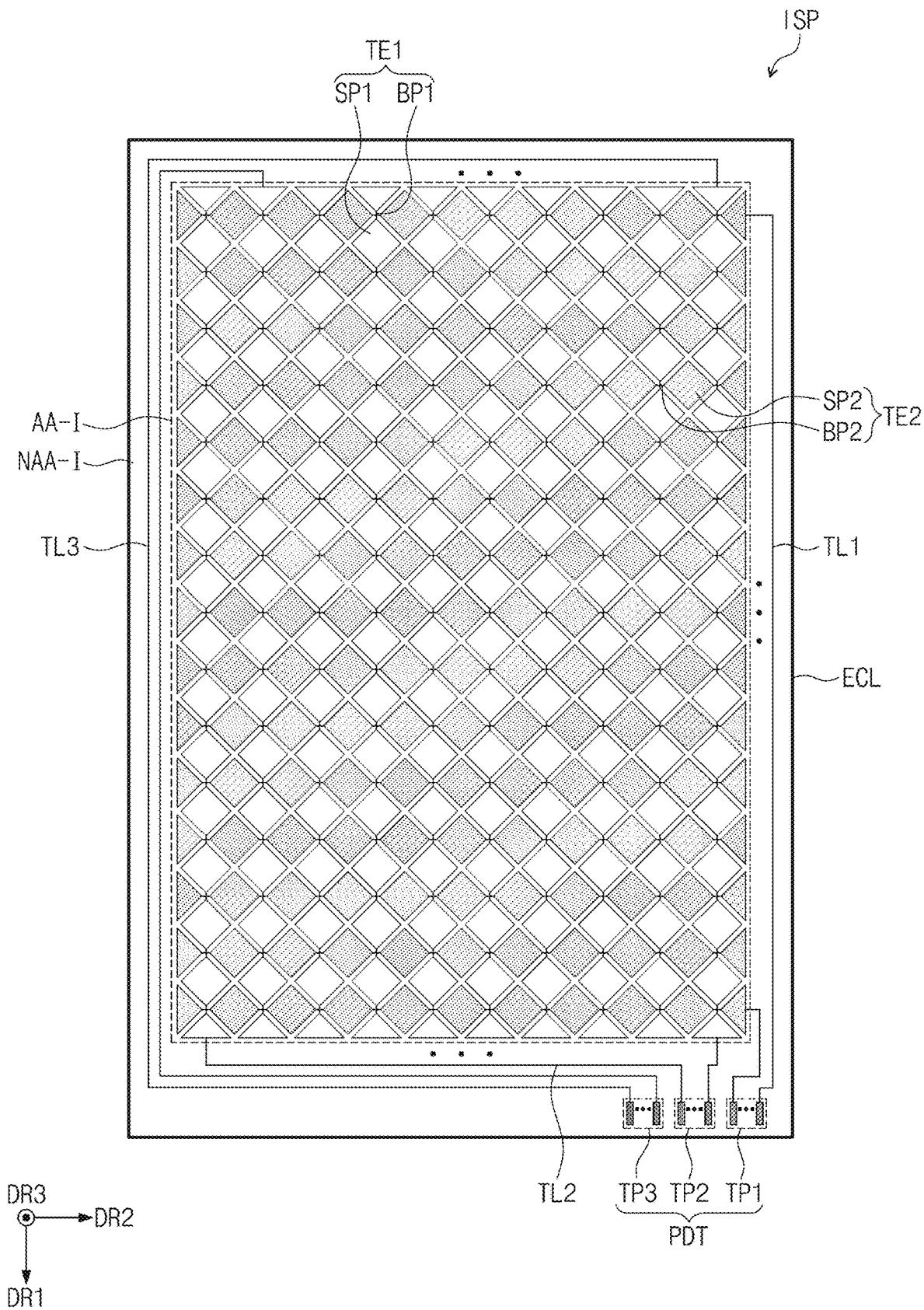
FIG. 5 is a plan view of an input sensing panel according to an embodiment of the inventive concept.

FIG. 3A is a cross-sectional view of a display module according to an embodiment of the inventive concept. FIG. 3B is an enlarged cross-sectional view of the display module of FIG. 3A. FIG. 4 is a plan view of a display panel according to an embodiment of the inventive concept. FIG. 5 is a plan view of an input sensing panel according to an embodiment of the inventive concept.

Referring to FIGS. 3A and 3B, the display module DM may include a display panel DP and an input sensing panel ISP.

The display panel DP may include a base substrate BS, a circuit element layer ML-D, a display element layer EML, and a thin film encapsulation layer ECL. The input sensing panel ISP may include a plurality of sensing insulating layers TIL1, TIL2, and TIL3 and a plurality of conductive layers TML1 and TML2.

The base substrate BS may be a base layer on which the circuit element layer ML-D, the display element layer EML, the thin film encapsulation layer ECL, and the input sensing panel ISP may be stacked. The base substrate BS may be flexible or rigid, may be provided as a single layer or may have a multilayer structure, and is not limited to any one embodiment above.

The circuit element layer ML-D may be disposed on the base substrate BS. The circuit element layer ML-D may include a plurality of insulating layers, a plurality of conductive layers, and a semiconductor layer. The plurality of conductive layers of the circuit element layer ML-D may constitute signal lines or a control circuit for pixels.

The display element layer EML may be disposed on the circuit element layer ML-D. The display element layer EML may include organic light emitting diodes. However, this is merely presented as an example, and the display element layer EML according to an embodiment of the inventive concept may include inorganic light emitting diodes, organic-inorganic light emitting diodes, or a liquid crystal layer.

The thin film encapsulation layer ECL may include an organic layer OEL and a plurality of inorganic layers LIL and UIL for sealing the organic layer. The thin film encapsulation layer ECL may seal the display element layer EML to prevent moisture and oxygen from being introduced into the display element layer EML.

The inorganic layers LIL and UIL may prevent external moisture or oxygen from penetrating into the display element layer EML. The inorganic layers LIL and UIL may include silicon nitride, silicon oxide, or a combination thereof. The inorganic layers may be formed through a deposition process.

The organic layer OEL may be disposed on the display element layer EML to provide a flat surface. Curves or particles formed on an upper surface of the display element layer EML may be covered by the organic layer OEL to prevent components formed on the organic layer OEL, for example, the input sensing panel ISP from being affected.

The input sensing panel ISP is disposed on the thin film encapsulation layer ECL. The input sensing panel ISP may be directly disposed on the thin film encapsulation layer ECL to be formed through a continuous process along with the thin film encapsulation layer ECL. The input sensing panel ISP may sense an external input through any one of a self-capacitance type or a mutual capacitance type. Sensing patterns included in the input sensing panel ISP may be variously deformed according to the types to be arranged and connected.

The input sensing panel ISP may include sensing insulating layers TIL1, TIL2, and TIL3 and at least one conductive layer TML1 and TML2. The sensing insulating layers TIL1, TIL2, and TIL3 may include any one of an inorganic material or an organic material.

The first sensing insulating layer TIL1 may be directly disposed on the second inorganic layer UIL of the thin film encapsulation layer ECL. The first conductive layer TML1 is disposed on the first sensing insulating layer TIL1. The second sensing insulating layer TIL2 is disposed on the first sensing insulating layer TIL1 and may cover the first conductive layer TML1. The second conductive layer TML2 is disposed on the second sensing insulating layer TIL2. The third sensing insulating layer TIL3 is disposed on the second insulating layer TIL2, and may cover the second conductive layer TML2. However, the embodiment of the inventive concept is not limited thereto, the first sensing insulating layer TIL1 may be omitted, the first conductive layer TML1 may be directly disposed on the second inorganic layer UIL, and is limited to any one embodiment above.

The conductive layers TML1 and TML2 according to an embodiment may include any one of a single-layered metal or a transparent conductive material. For example, the metal may include molybdenum, silver, titanium, copper, aluminum, and an alloy thereof.

The transparent conductive layer may include a transparent conductive oxide such as indium tin oxide ("ITO"), indium zinc oxide ("IZO"), zinc oxide (ZnO), or indium tin zinc oxide ("ITZO"). In addition, the transparent conductive layer may include a conductive polymer such as PEDOT, a metal nanowire, graphene, etc.

In addition, the conductive layers TML1 and TML2 may include multi-layered metal layers. The multi-layered metal layers may have a three-layer structure of, for example, titanium/aluminum/titanium. The multi-layered conductive layers TML1 and TML2 may include at least one metal layer and at least one transparent conductive layer.

Referring to FIG. 4, the active area AA of the display panel DP may be an area displaying an image, and the peripheral area NAA may be an area having a driving circuit, a driving wiring, etc. disposed. In the active area AA, light emitting elements of each of a plurality of pixels PX may be disposed. The active area AA may overlap at least a portion of the transmissive area TA, and the peripheral area NAA may be covered by the bezel area BZA.

A plurality of signal lines GL, DL, PL, and EL may be connected to the pixels PX to transmit electrical signals to the pixels PX. Among the signal lines included in the display panel DP, a scan line GL, a data line DL, a power line PL, and a light emitting control line EL are exemplarily illustrated. However, this is presented as an example, and the signal lines GL, DL, PL, and EL according to an embodiment of the inventive concept may further include an initialization voltage line, and are not limited to any one embodiment above.

A power pattern VDD may be disposed in the peripheral area NAA. The power pattern VDD may be connected to a plurality of power lines PL. Accordingly, the display panel DP includes the power pattern VDD, and may thus provide identical first power signals to the plurality of pixels PX.

Display pads PDD are disposed in the peripheral area NAA. The display pads PDD may include a first pad D1 and a second pad D2. The first pad D1 may be provided in plurality to be each connected to the data lines DL. The second pad D2 may be connected to the power pattern VDD to be electrically connected to the power line PL. The display panel DP is connected to the flexible circuit board FCB through the display pads PDD, thereby providing electrical signals provided from the main circuit board MCB to the pixels PX. Meanwhile, the display pads PDD may further include pads for receiving other electrical signals in addition to the first pad D1 and the second pad D2, and the embodiment of the inventive concept is not limited to any one embodiment above.

Referring to FIG. 5, the input sensing panel ISP may include a plurality of sensing electrodes TE1 and TE2, a plurality of sensing wirings TL1, TL2, and TL3, and a plurality of sensing pads PDT. The plurality of sensing electrodes TE1 and TE2, the plurality of sensing wirings TL1, TL2 and TL3, and the plurality of sensing pads PDT may form a sensing circuit layer ML-T of FIG. 3A.

The input sensing panel ISP may be divided into an active area AA-I and a peripheral area NAA-I adjacent to the active area AA-I. The peripheral area NAA-I may surround the active area AA-I.

The plurality of sensing electrodes TE1 and TE2 may include a first sensing electrode TE1 and a second sensing electrode TE2.

The first sensing electrode TE1 may extend in the first direction DR1 and be provided in plurality to be arranged along the second direction DR2. The first sensing electrode TE1 may include first sensing patterns SP1 and first bridge patterns BP1. The first sensing patterns SP1 may be arranged along the first direction DR1. At least one first bridge pattern BP1 may be connected to two first sensing patterns SP1 which are adjacent to each other.

The second sensing electrode TE2 may extend in the second direction DR2 and be provided in plurality to be arranged along the first direction DR1. The second sensing electrode TE2 may include second sensing patterns SP2 and second bridge patterns BP2. The second sensing patterns SP2 may be arranged along the second direction DR2. At least one second bridge pattern BP2 may extend from two second sensing patterns SP2 which are adjacent to each other.

The sensing wirings TL1, TL2, and TL3 may be disposed in the peripheral area NAA-I. The sensing wirings TL1, TL2, and TL3 may include a first sensing wiring TL1, a second sensing wiring TL2, and a third sensing wiring TL3.

The first sensing wiring TL1 may be connected to the second sensing electrode TE2. The second sensing wiring TL2 may be connected to one end of the first sensing electrode TE1. The third sensing wiring TL3 may be connected to the other end of the first sensing electrode TE1. The other end of the first sensing electrode TE1 may be a portion opposing the one end of the first sensing electrode TE1.

The first sensing electrode TE1 according to an embodiment of the inventive concept may be connected to the second sensing wiring TL2 and the third sensing wiring TL3. Accordingly, sensitivity according to an area may be uniformly maintained for the first sensing electrode TE1 having a relatively longer length than the second sensing electrode TE2. However, this is presented as an example, and the third sensing wiring TL3 according to an embodiment of the inventive concept may be omitted, and is not limited to any one embodiment above.

The sensing pads PDT may be disposed in the peripheral area NAA-I. The sensing pads PDT may include a first sensing pad TP1, a second sensing pad TP2, and a third sensing pad TP3. The first sensing pad TP1 may be connected to the first sensing wiring TL1 to be electrically connected to the first sensing electrode TE1. The second sensing pad TP2 may be connected to the second sensing wiring TL2. The third sensing pad TP3 may be connected to the third sensing wiring TL3. Accordingly, the second sensing pad TP2 and the third sensing pad TP3 may be electrically connected to the second sensing electrode TE2.

However, the embodiment of the inventive concept is not limited thereto, and the sensing pads PDT of the input sensing panel ISP may be disposed on the same layer as the display pads PDD of the display panel DP through contact holes defined in the sensing insulating layers, and are not limited to any one embodiment above.

Figure 6:
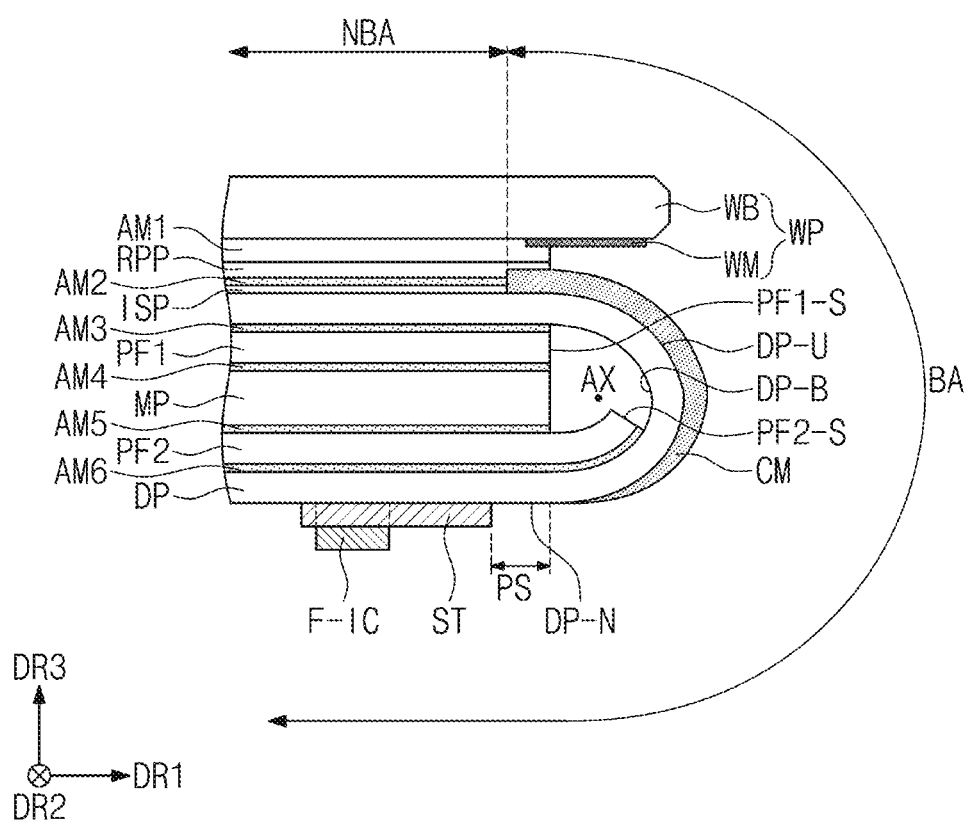
FIG. 6 is a cross-sectional view of an electronic apparatus according to an embodiment of the inventive concept.
Figure 8:
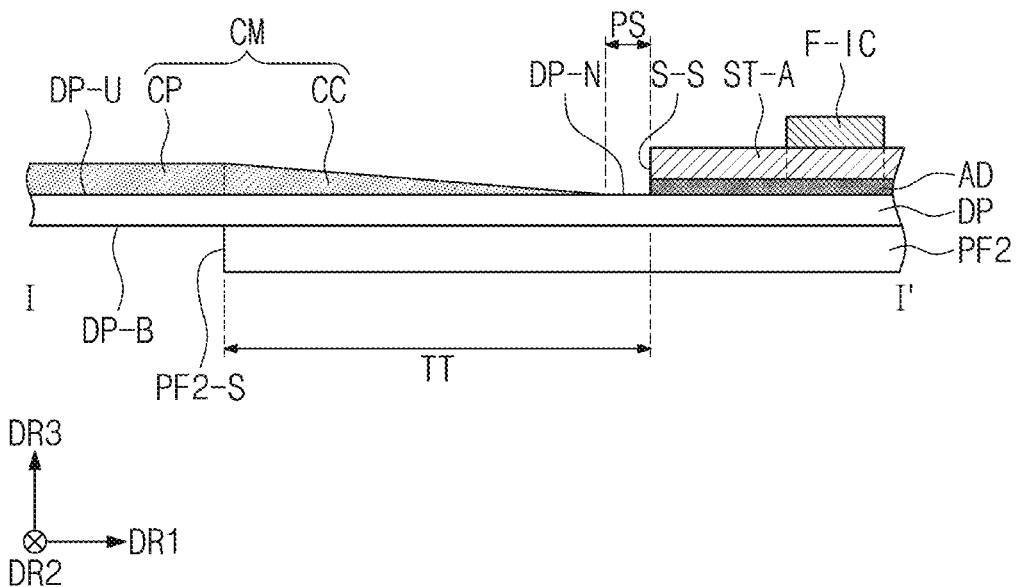
FIG. 8 is a cross-sectional view taken along line I-I' shown in FIG. 2A.

FIG. 6 is a cross-sectional view of an electronic apparatus according to an embodiment of the inventive concept. FIG. 7 is a rear view of an electronic apparatus according to an embodiment of the inventive concept. FIG. 8 is a cross-sectional view taken along line I-I' shown in FIG. 2A. The same or similar reference numerals are given for the configurations which are the same as or similar to the one in FIGS. 1 to 5, and redundant descriptions are omitted.

Referring to FIG. 6, the window panel WP may include a base window WB and a bezel pattern WM. The base window WB may include an optically transparent insulating material. For example, the base window WB may include a glass substrate or a synthetic resin film. An anti-fingerprint layer and a hard coating layer for protecting the base window WB may be disposed on the front and rear surfaces of the base window WB. In addition, in an embodiment, the base window WB may have a chamfered edge.

The bezel pattern WM may define the bezel area BZA of the window panel WP. The bezel pattern WM is a colored layer and may be formed through a coating method. The bezel pattern WM may include a polymer resin and a pigment mixed with a polymer resin. The polymer resin may be, for example, an acrylic-based resin or polyester, and the pigment may be a carbon-based pigment.

In an embodiment according to the inventive concept, a portion of the display module DM may be bent to be accommodated in the housing HU. For example, an area of the display panel DP which does not overlap the input sensing panel ISP when the display panel DP is not bent may be bent along a virtual bending axis AX extending in the second direction DR2. Accordingly, the display panel DP may be divided into a bending area BA and a non-bending area NBA along the first direction DR1. The non-bending area NBA is a part of the display panel DP from a border between the bending area BA and the non-bending area NBA to one end of the display panel DP in the first direction DR1. The bending area BA is the remaining part of the display panel DP from the border to the other end of the display panel DP opposite the one end in the first direction DR1. The display panel DP may include a front surface DP-U and a rear surface DP-B.

In an embodiment, the cover member CM, the stiffener ST, and the driving element F-IC may be disposed on the front surface DP-U of the display panel DP, and the first protection member PF1 and the second protection member PF2 may be disposed on the rear surface DP-B of the display panel DP.

The cover member CM covers a portion of the bending area BA and is disposed on the front surface DP-U of the display panel DP. The first protection member PF1 is disposed on the rear surface DP-B of the display panel DP and overlaps the non-bending area NBA, and the second protection member PF2 is disposed on the rear surface DP-B of the display panel DP, overlaps the bending area BA and is spaced apart from the first protection member PF1. The driving element F-IC is disposed on the front surface DP-U of the display panel DP and overlaps the bending area BA, and the stiffener ST is disposed between the cover member CM and the driving element F-IC on the front face DP-U to cover at least a side portion of the driving element F-IC.

The stiffener ST and the cover member CM may be disposed to be spaced apart from each other through a predetermined space PS therebetween. Accordingly, as much as the space PS, a portion DP-N (an exposed surface) of the front surface DP-U of the display panel DP may be exposed between the stiffener ST and the cover member CM.

According to the inventive concept, adhesive layers AM1 to AM6 may be disposed between the respective components. For example, the first adhesive layer AM1 may be disposed between the window panel WP and the anti-reflection panel RPP to combine the window panel WP and the anti-reflection panel RPP. The second adhesive layer AM2 may be disposed between the anti-reflection panel RPP and the input sensing panel ISP to combine the anti-reflection panel RPP and the input sensing panel ISP. The third adhesive layer AM3 may be disposed between the display panel DP and the first protection member PF1 to combine the display panel DP and the first protection member PF1. The fourth adhesive layer AM4 may be disposed between the first protection member PF1 and the functional layer MP to combine the first protection member PF1 and the functional layer MP. The fifth adhesive layer AM5 may be disposed between the functional layer MP and the second protection member PF2 to combine the functional layer MP and the second protection member PF2. The sixth adhesive layer AM6 may be disposed between the second protection member PF2 and the display panel DP to combine the second protection member PF2 and the display panel DP.

The adhesive layers AM1 to AM6 according to the inventive concept may be a transparent adhesive layer such as a pressure sensitive adhesive film ("PSA"), an optically clear adhesive film ("OCA"), or an optically clear resin ("OCR").

According to the inventive concept, when a portion of the display panel DP is bent, the bending may be affected by the stiffener ST including stainless steel. For example, in rigidity, the display panel DP to which the stiffener ST is attached may be stronger than the display panel to which the stiffener ST is not attached. Accordingly, the display panel DP to which the stiffener ST is attached may interfere with a component disposed on the rear surface DP-B of the display panel DP. For example, the display panel DP may be pitted by a side surface PF2-S of the second protection member PF2 disposed on the rear surface DP-B.

Referring to FIG. 7, a large-capacity power supply module PSM is mounted on, thus the size of the power supply module PSM increases, and accordingly, a separation distance TH in the first direction DR1 between the power supply module PSM and the main circuit board MCB decreases. Therefore, the space PS between the stiffener ST and the cover member CM is reduced, causing the interference between the stiffener ST and the cover member CM.

Referring to FIG. 8, a stiffener ST-A may be disposed on the front surface DP-U of the display panel DP with an adhesive layer AD therebetween. In the present embodiment, a side surface S-S of the stiffener ST-A, which is adjacent to the cover member CM, may be aligned with (i.e., coplanar with) a side surface of the adhesive layer AD, which is adjacent to the cover member CM. The alignment in the inventive concept may include errors (i.e., deviation) in processes.

The adhesive layer AD may be a transparent adhesive layer such as a pressure sensitive adhesive film (PSA), an optically clear adhesive film (OCA), or an optically clear resin (OCR).

The stiffener ST-A of the inventive concept may be disposed at a predetermined distance from a side surface PF2-S of the second protection member PF2 in the first direction DR1. According to the inventive concept, a distance TT from the side surface PF2-S of the second protection member PF2 facing the side surface PF1-S of the first protection member PF1 to the side surface S-S of the stiffener ST-A adjacent to the cover member CM may be about 2 millimeters (mm) or greater.

TABLE 1

|  | <Comparative Example 0> | <Comparative Example 1> | <Comparative Example 2> | <Comparative Example 3> |
| --- | --- | --- | --- | --- |
| Stiffener (○/X) | X | ○ | ○ | ○ |
| Separation distance (mm) |  | 1.6 | 2.00 | 2.11 |
| [Defect] | X | ○ | X | X |

Referring to Table 1, [defect] indicates experimental data showing whether or not a defect that the rear surface DP-B of the display panel DP is pitted due to the second protection member PF2 is caused when the bending area BA of the display panel DP is bent multiple times. Comparative Example 0 is the case where the bending area BA of the display panel DP is bent a plurality of times when the stiffener ST-A is not attached to the display panel DP. The display panel DP to which the stiffener ST-A is not attached is relatively weaker in rigidity than the display panel DP to which the stiffener ST-A is attached, thereby having improved bending properties. Accordingly, the defect that the rear surface DP-B of the display panel DP is pitted due to the second protection member PF2 may be prevented.

Comparative Examples 1 to 3 are the cases where the bending area BA of the display panel DP is bent multiple times when the stiffener ST-A is attached to the display panel DP.

As in Comparative Example 1, when the distance TT from the side surface PF2-S of the second protection member PF2 facing the side surface PF1-S of the first protection member PF1 to the side surface S-S of the stiffener ST-A adjacent to the cover member CM is about 1.66 mm, the defect that the rear surface DP-B of the display panel DP is pitted due to the second protection member PF2 may be caused.

As in Comparative Examples 2 and 3, when the distance TT from the side surface PF2-S of the second protection member PF2 facing the side surface PF1-S of the first protection member PF1 to the side surface S-S of the stiffener ST-A adjacent to the cover member CM is about 2.00 mm or greater, the defect that the rear surface DP-B of the display panel DP is pitted due to the second protection member PF2 may not be caused.

According to the inventive concept, the stiffener ST-A is disposed at a predetermined distance from the side surface PF2-S of the second protection member PF2 disposed to overlap the bending area BA of the display panel DP, and thus a defect due to interference between the second protection member PF2 disposed on the rear surface DP-B of the display panel DP and the display panel DP may be prevented. Accordingly, an electronic apparatus EA having improved reliability may be provided.

In an embodiment, the cover member CM may include a first cover part CP and a second cover part CC. The first cover part CP may be relatively closer to the non-bending area NBA than the second cover part CC. The second cover part CC may extend from the first cover part CP. The second cover part CC may be inclined in a direction towards the stiffener ST-A from the first cover part CP. That is, the thickness of the second cover part CC in a thickness direction of the display panel DP gradually decreases along the direction from the first cover part CP to the stiffener ST-A.

In addition, in the inventive concept, the distance TT from the side surface PF2-S of the second protection member PF2 facing the side surface PF1-S of the first protection member PF1 to the side surface of the stiffener ST-A adjacent to the cover member CM may be about 2.5 mm or less.

Figure 9:
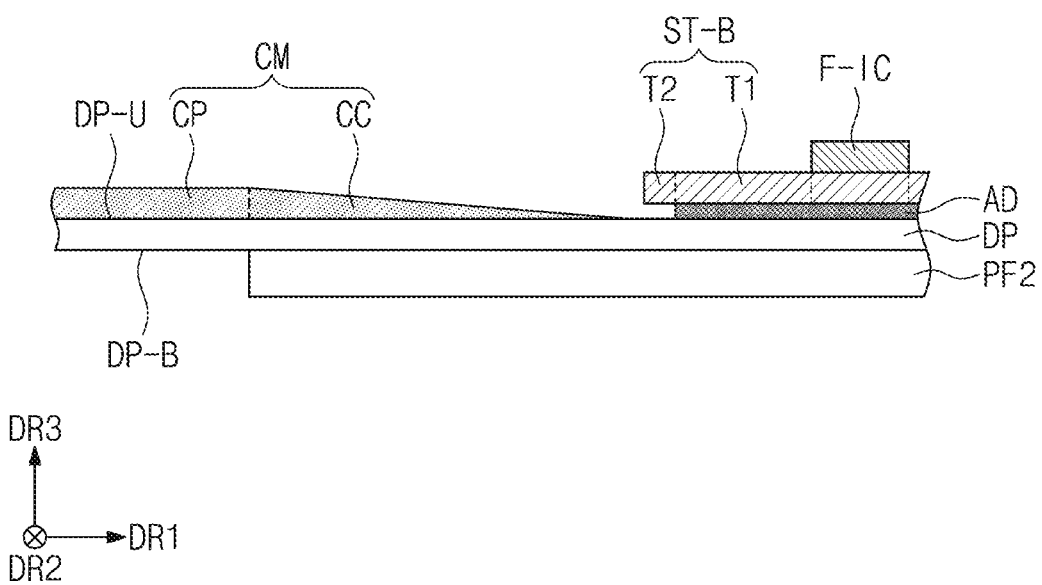
FIG. 9 is a cross-sectional view of components of an electronic apparatus according to an embodiment of the inventive concept.
Figure 10:
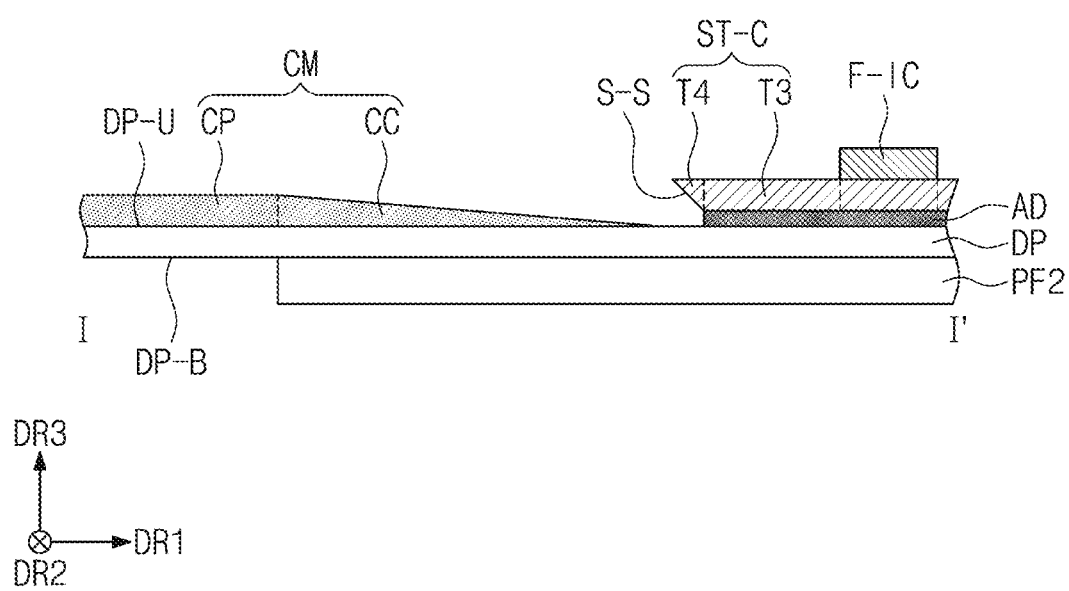
FIG. 10 is a cross-sectional view of components of an electronic apparatus according to another embodiment of the inventive concept.

FIG. 9 is a cross-sectional view of components of an electronic apparatus according to an embodiment of the inventive concept. FIG. 10 is a cross-sectional view of components of an electronic apparatus according to an embodiment of the inventive concept. FIGS. 9 and 10 are other embodiments of a cross-sectional view taken along line I-I' shown in FIG. 2A. The same or similar reference numerals are given for the configurations which are the same as or similar to the one in FIGS. 1 to 8, and redundant descriptions are omitted.

Referring to FIG. 9, in the present embodiment, a stiffener ST-B may include a first portion T1 and a second portion T2. The first portion T1 may overlap the adhesive layer AD, and the second portion T2 may not overlap the adhesive layer AD. The second portion T2 may protrude from the first adhesive layer T1 towards the cover member CM, that is, in the first direction DR1.

Referring to FIG. 10, in the present embodiment, a stiffener ST-C may include a first portion T3 and a second portion T4. The first portion T3 may overlap the adhesive layer AD, and the second portion T4 may not overlap the adhesive layer AD. The second portion T4 may protrude from the first adhesive layer T3 towards the cover member CM, that is, in the first direction DR1.

In the present embodiment of FIG. 10, the side surface S-S of the second portion T4 may be inclined in a direction towards the side surface of the adhesive layer AD adjacent to the cover member CM. In other words, the side surface S-S of the second portion T4 may be inclined with respect to a plane of the side surface of the adhesive layer AD adjacent to the cover member CM.

According to an embodiments, the stiffeners ST-B and ST-C are spaced apart from the front surface DP-U of the display panel DP along the third direction DR3 by the adhesive layer AD, and include the second portions T2 and SP4 protruding from the adhesive layer AD, and thus the size of the power supply module PSM increases as shown in FIG. 7, thereby providing the stiffeners ST-B and ST-C without having interference with the cover member CM even when the space PS between the cover member CM and the stiffeners ST-B and ST-C is reduced.

According to the inventive concept, a stiffener is disposed at a predetermined distance from a side surface of a second protection member disposed to overlap a bending area of a display panel, and thus a defect due to interference between the second protection member disposed on a rear surface DP-B of the display panel and the display panel may be prevented. Accordingly, an electronic apparatus having improved reliability may be provided.

Although the inventive concept has been described with reference to a preferred embodiment of the inventive concept, it will be understood that the inventive concept should not be limited to these preferred embodiments but various changes and modifications can be made by those skilled in the art without departing from the spirit and scope of the inventive concept.

Accordingly, the technical scope of the inventive concept is not intended to be limited to the contents set forth in the detailed description of the specification, but is intended to be defined by the appended claims.

What is claimed is:

1. An electronic apparatus comprising:
   a display module divided into a bending area and a non-bending area arranged in a first direction and having a front surface and a rear surface opposing the front surface;
   a cover member covering a portion of the bending area and disposed on the front surface;
   a first protection member disposed on the rear surface and overlapping the non-bending area;
   a second protection member disposed on the rear surface, overlapping the bending area and spaced apart from the first protection member;
   a driving element disposed on the front surface and overlapping the bending area; and
   a stiffener disposed between the cover member and the driving element on the front surface, wherein the bending area is bent along a virtual bending axis extending along a second direction perpendicular to the first direction, and the cover member and the stiffener expose a portion of the front surface through a space between the cover member and the stiffener.

2. The electronic apparatus of claim 1, wherein a distance from a side surface of the second protection member facing a side surface of the first protection member to a side surface of the stiffener adjacent to the cover member in the first direction is about 2.0 millimeters (mm) or greater.

3. The electronic apparatus of claim 1, wherein the stiffener is attached to the front surface through an adhesive layer.

4. The electronic apparatus of claim 3, wherein the side surface of the stiffener adjacent to the cover member is aligned with a side surface of the adhesive layer adjacent to the cover member.

5. The electronic apparatus of claim 3, wherein the stiffener comprises a first portion overlapping the adhesive layer, and a second portion protruding towards the cover member from the first portion.

6. The electronic apparatus of claim 5, wherein the second portion is inclined with respect to the side surface of the adhesive layer adjacent to the cover member.

7. The electronic apparatus of claim 1, wherein the stiffener comprises stainless steel.

8. The electronic apparatus of claim 1, wherein the cover member comprises a first cover part adjacent to the non-bending area, and a second cover part extending from the first cover part, and the second cover part is inclined towards the stiffener from the first cover part when the display module is not bent.

9. The electronic apparatus of claim 1, further comprising:

a functional layer which is disposed between the first protection member and the second protection member in a state that the electronic apparatus is bent along the virtual bending axis, the functional layer comprising at least one of a light blocking layer, a heat dissipation layer, and a cushion layer.

10. The electronic apparatus of claim 1, wherein the display module comprises:

a display panel having a plurality of pixels, and an input sensing panel directly disposed on the display panel and which senses an external input.

11. The electronic apparatus of claim 10, wherein the input sensing panel comprises:

a first sensing insulating layer in contact with the display panel;

a first conductive layer disposed on the first sensing insulating layer;

a second sensing insulating layer disposed on the first sensing insulating layer and covering the first conductive layer;

a second conductive layer disposed on the second sensing insulating layer; and a third sensing insulating layer disposed on the second sensing insulating layer and covering the second conductive layer.

12. The electronic apparatus of claim 1, wherein the stiffener surrounds at least a portion of the driving element.

13. The electronic apparatus of claim 1, further comprising:

a flexible circuit board disposed on the front surface and overlapping the bending area, and a main circuit board connected to the display module through the circuit board.

14. An electronic apparatus comprising:

a display panel divided into a bending area and a non-bending area arranged in a first direction and having a front surface which display an image and a rear surface opposing the front surface;

an input sensing panel which senses an external input, is disposed on the front surface and overlaps the non-bending area;

a cover member covering a portion of the bending area and disposed on the front surface;

a first protection member disposed on the rear surface and overlapping the non-bending area;

a second protection member disposed on the rear surface, overlapping the bending area and spaced apart from the first protection member;

a driving element disposed on the front surface and overlapping the bending area; and a stiffener disposed between the cover member and the driving element on the front surface, wherein the bending area is bent along a virtual bending axis extending along a second direction perpendicular to the first direction, and the cover member and the stiffener expose a portion of the front surface through a space between the cover member and the stiffener.

15. The electronic apparatus of claim 14, wherein a distance from a side surface of the second protection member facing a side surface of the first protection member to a side surface of the stiffener adjacent to the cover member in the first direction is about 2.0 mm or greater.

16. The electronic apparatus of claim 14, wherein the stiffener is attached to the front surface through an adhesive layer.

17. The electronic apparatus of claim 16, wherein the side surface of the stiffener adjacent to the cover member is aligned with a side surface of the adhesive layer adjacent to the cover member.

18. The electronic apparatus of claim 16, wherein the stiffener comprises a first portion overlapping the adhesive layer, and a second portion protruding towards the cover member from the first portion.

19. The electronic apparatus of claim 18, wherein the second portion is inclined with respect to the side surface of the adhesive layer adjacent to the cover member.

20. The electronic apparatus of claim 14, wherein the input sensing panel comprises:

a first sensing insulating layer in contact with the display panel;

a first conductive layer disposed on the first sensing insulating layer;

a second sensing insulating layer disposed on the first sensing insulating layer and covering the first conductive layer;

a second conductive layer disposed on the second sensing insulating layer; and a third sensing insulating layer disposed on the second sensing insulating layer and covering the second conductive layer.

* * * * *